United States Patent [19]
Clark et al.

[11] Patent Number: 6,133,563
[45] Date of Patent: *Oct. 17, 2000

[54] SENSOR CELL HAVING A SOFT SATURATION CIRCUIT

[75] Inventors: Lawrence T. Clark, Phoenix; Mark A. Beiley; Eric J. Hoffman, both of Chandler, all of Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/940,077

[22] Filed: Sep. 29, 1997

[51] Int. Cl.$^7$ ........................................... H01J 40/14
[52] U.S. Cl. .................. 250/208.1; 250/214 R; 327/514; 257/291
[58] Field of Search ........................... 250/208.1, 214 R, 250/214 L; 327/514, 515, 437; 257/290, 291, 292

[56] References Cited

U.S. PATENT DOCUMENTS 5,471,515  11/1995  Fossum et al. .
5,572,074  11/1996  Standley .............................. 250/208.1

*Primary Examiner*—Edward P. Westin
*Assistant Examiner*—Kevin Pyo
*Attorney, Agent, or Firm*—Blakely, Sokoloff, Taylor & Zafman LLP

[57] ABSTRACT

A method for providing an improved active pixel sensor cell having a soft-saturation circuit. The method includes providing a pixel node and a photodiode coupled to the pixel node. The photodiode receives light and converts the light into an electrical signal representative of light. A soft-saturation circuit for selectively affecting the electrical signal at the pixel node based on the electrical signal at the pixel node based on the electrical signal at the pixel node is also provided.

48 Claims, 8 Drawing Sheets

SENSOR CELL HAVING A SOFT SATURATION CIRCUIT

BACKGROUND OF THE INVENTION

1. Field of the Invention

The present invention relates generally to active-pixel sensors and more particularly to an improved sensor cell having a soft saturation circuit.

2. Description of the Related Art

An important component in an image capture device is an imager integrated circuit that converts incident light into a representative electrical signal. A key component in an imager integrated circuit is a sensor array that includes a plurality of sensor cells arranged in rows and columns. The performance of each sensor cell largely determines the quality of a captured image. Consequently, by improving the sensor cell architecture, the quality of the captured image can be increased.

FIG. 1 illustrates an active pixel sensor (APS) cell 10 employed in conventional digital image capture devices. The active pixel sensor cell 10 includes a photodiode 12 coupled to a RESET transistor 14 and a source follower 16. The RESET transistor 14 selectively resets a pixel node 18 to a predetermined voltage. When a READOUT signal is asserted, the source follower 16 provides the voltage of the pixel node 18 to an image capture system (not shown). Incident light causes the pixel node 18 voltage to drop by collection of electrons photogenerated in the diode space-charge region.

A disadvantage of the cell illustrated in FIG. 1 is that during high light conditions in an array of cells of this type, many of the pixel cells are saturated, resulting in a picture having pixel cells that are washed-out. In other words, all pixels having an amount above a specified amount of incident light appear the same and any detail or contrast between these pixels is lost.

One approach to prevent saturation of the image is to shorten integration time. However, when the integration time is shortened, the sensitivity of the cell also decreases. For example, resolution and detail between pixel cells having low light dramatically decreases. Instead of a washing-out of the picture, the entire scene is dimmed. Moreover, contrast between objects and/or details of low light pixels are lost.

FIG. 2 illustrates a scene presented for capture to an image capture device. This scene includes the sun in the upper left hand corner, an airplane in the upper right hand corner, a building having a shadow in the lower left hand corner and a person standing in the shadow of the building also on the lower left hand corner.

In order to capture the building, the shadow and the person standing in the shadow, the integration time is lengthened. However, the result of lengthening the integration time is that the sun and the airplane are lost as the pixels having greater than a predetermined amount of incident light are saturated, and the picture is washed-out so that only the shadowed parts have contrast in the image.

When the integration time is shortened, the sun and the airplane are resolved. However, the shadow and the person, standing in the shadow, are lost. The shadow and the person do not appear in the image because the length of the integration time is not sufficient to resolve and/or capture the detail of those objects in the scene that are relatively dark as compared to other points in the scene.

Accordingly, there remains a need in the industry for an improved active-pixel sensor cell that can resolve detail of low light pixels and yet at the same time provide details and resolution of high light pixels.

BRIEF SUMMARY OF THE INVENTION

An active pixel sensor (APS) cell having a soft-saturation circuit is disclosed. The active pixel sensor cell includes a pixel node and a photodiode, coupled to the pixel node, for converting light into an electrical signal representative of the light. The APS cell also includes a soft-saturation circuit for selectively affecting the voltage on said pixel node based upon the electrical signal at the pixel node.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to schematic diagrams or circuit diagrams. Depending upon the implementation, the transistor devices can be p-devices, n-devices or combinations thereof.

The present invention finds wide application in numerous electronic products. These products include, but are not limited to, cameras employed for PC video conferencing, camcorders, digital still cameras, security cameras and other surveillance equipment, and feature portable products such as PC videophones or cellular videophones. In all these products and applications, an important component is a sensor array that accurately detects incident light and converts the light into an electrical signal representative of the light.

As noted in the Background, conventional sensors have a limited dynamic range due to the saturation problem discussed previously. The improved cell of the present invention employs a soft saturation circuit to resolve detail of low light pixels and to resolve details in highlight pixels. The improved cell of the present invention exhibits a soft saturation characteristic described in greater detail hereinafter, that effectively increases the dynamic range of the cell.

Figure 3:
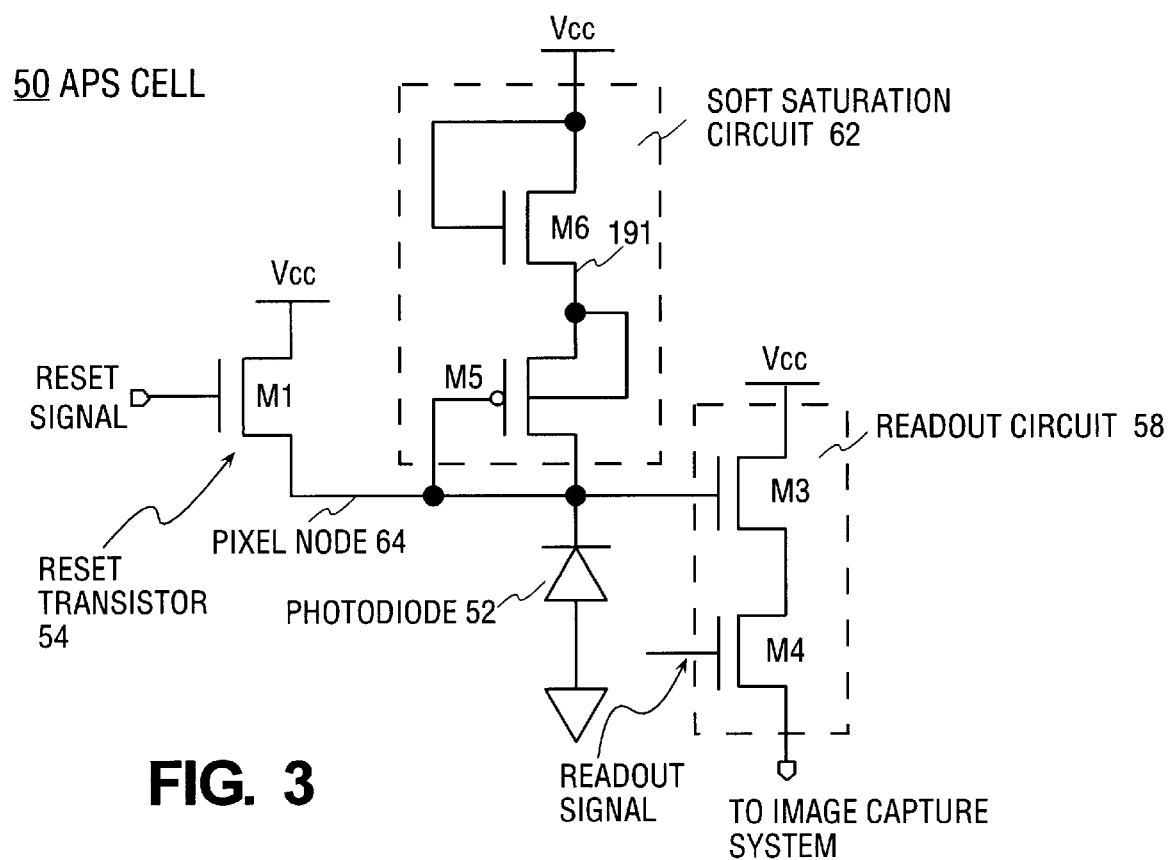
FIG. 3 illustrates a circuit diagram of an active pixel sensor, configured in accordance with one embodiment of the present invention.

FIG. 3 illustrates a circuit diagram of the active pixel sensor (APS) cell 50 configured in accordance with one embodiment of the present invention. The soft-saturating active pixel sensor cell 50 includes a photodiode 52, a reset transistor M1, a readout circuit 58 and a soft-saturation circuit 62.

Operation Of The APS Cell

A RESET signal is provided to a gate electrode of the RESET transistor 54. When the RESET signal is asserted, a pixel node 64 is set to a predetermined voltage. In one embodiment of the present invention, the predetermined voltage is approximately 3.3V. The photodiode 52 is then exposed to incident light that causes a current in the photodiode 52. The current in the photodiode 52 affects the electrical signal (e.g., a voltage value) at pixel node 64. In this embodiment, the more incident light, the higher the photodiode current which subsequently decreases the voltage at pixel node 64. The readout circuit 58 selectively provides the electrical signal at pixel node 64 to the image capture system based on a READOUT signal. The readout circuit 58 includes a source follower transistor M3 and a row selection transistor M4. Row selection transistor M4 includes a gate electrode for receiving the READOUT signal.

The soft-saturation circuit 62 is coupled to node 64. Under low light conditions, the soft-saturation circuit 62 does not affect a measure of the electrical signal (e.g., the voltage) on the pixel node 64. In high light level conditions, soft-saturation circuit 62 affects the measure of the electrical signal (e.g., the voltage) at node 64 in such a way as to avoid saturation of the image. The operation of the soft-saturation circuit 62 will be described in greater detail hereinafter.

Figure 4:
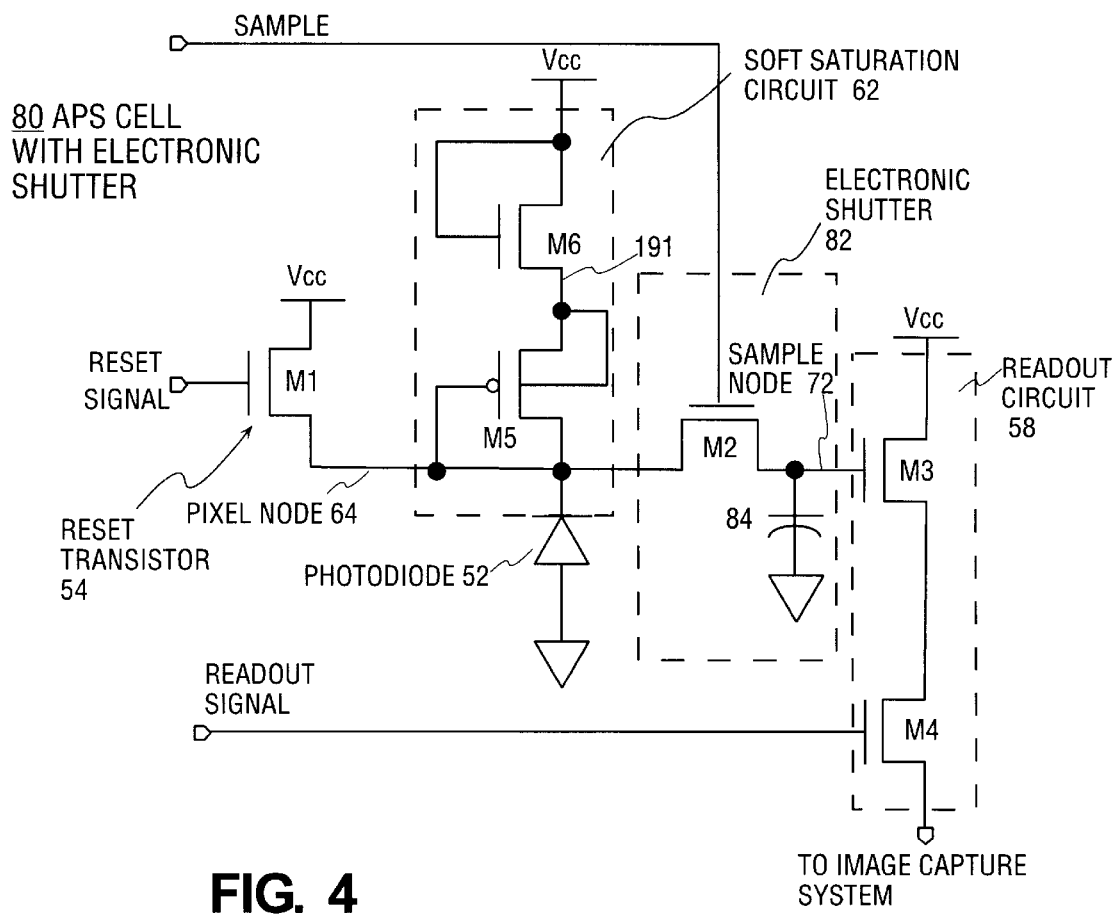
FIG. 4 illustrates a circuit diagram of an active pixel sensor, configured in accordance with a second embodiment of the present invention.

FIG. 4 illustrates a circuit diagram of the active pixel sensor cell 80 configured in accordance with a second embodiment of the present invention. FIG. 4 illustrates how the soft-saturation circuit 62 can be implemented in an APS cell 80 having an electronic shutter 82. The electronic shutter 82, interposed between pixel node 64 and a sample node 72, includes a pass transistor M2 and a storage capacitor 84. Transistor M2 includes a gate electrode for receiving a SAMPLE signal. When the SAMPLE signal is asserted, the transistor M2 selectively transfers an electrical signal at pixel node 64 to sample node 72. In the preferred embodiment, the SAMPLE signal is asserted throughout integration and is deasserted to end integration. This pixel value at the sample node 72 is stored on the storage capacitor 84. When the READOUT signal is asserted, the electrical signal at sample node 72 is provided to the system.

Figure 5:
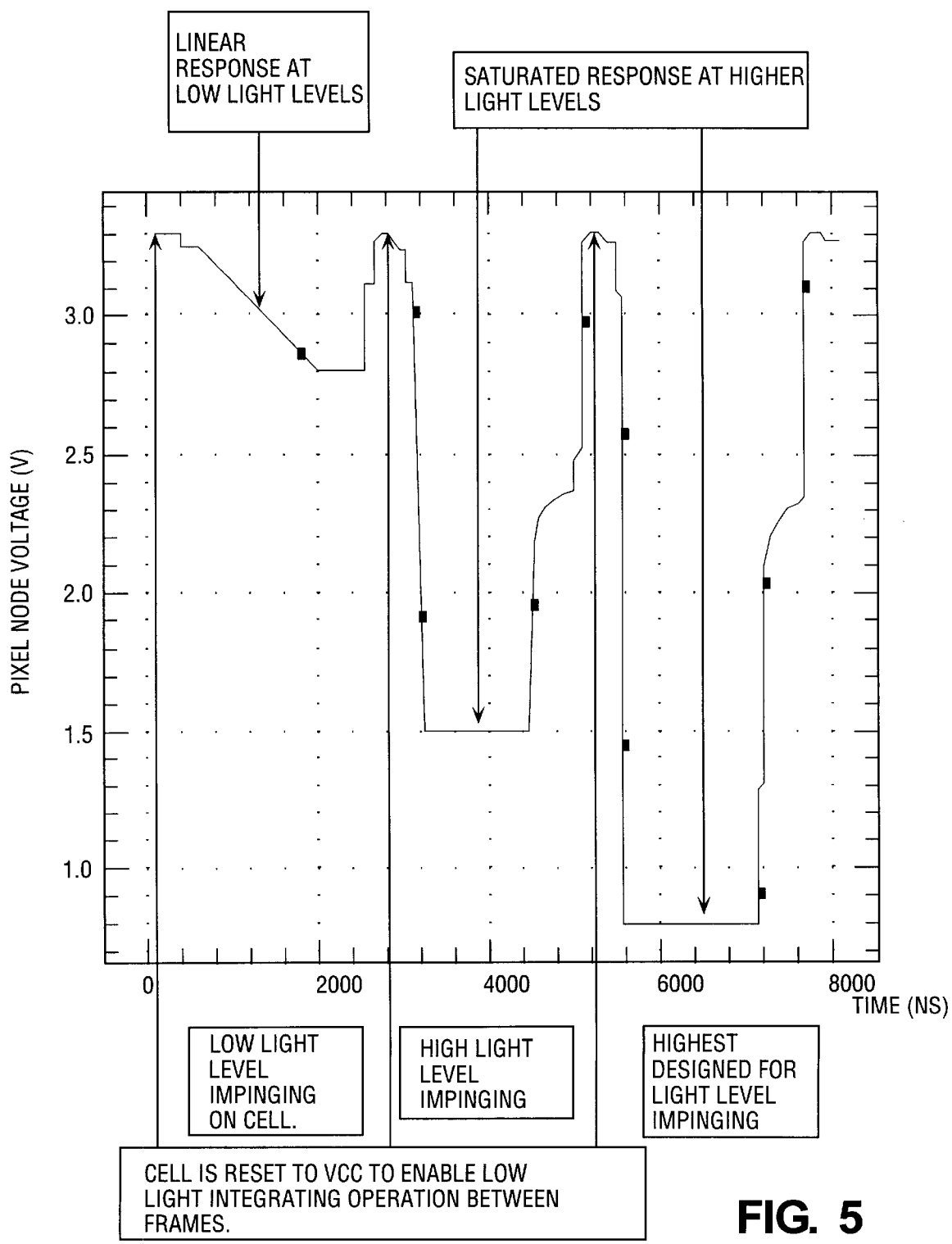
FIG. 5 illustrates a pixel node voltage versus time graph of the active pixel sensor cell, configured in accordance with one embodiment of the present invention.

FIG. 5 illustrates a pixel node voltage versus time graph of an APS cell configured in accordance with one embodiment of the present invention. The APS cell includes the soft saturation circuit 62 of the present invention. It is evident from this graph that the APS cell incorporating the soft saturation circuit of the present invention exhibits a linear response at low light levels. Moreover, at high light levels, the APS cell employing the soft-saturation circuit of the present invention exhibits a saturated response that is a square-root function of the input light level. The square-root function is similar to taking the logarithm of the input light level in that a similar compression of the light values is achieved (i.e., larger values are mapped to smaller values, but with a fixed resolution). Consequently, light values which are sufficiently far apart are distinguishable. For example, if an input light level has a value of 9, then the compressed light level has a value of 3. Moreover, if the input light level has a value of 16, then the compressed light level has a value of 4. Light levels below a predetermined threshold are not compressed. Whereas conventional cells exhibit "hard" saturation (i.e., all pixel values below a specified minimum are the same), the cell of the present invention exhibits "soft" saturation. The response is referred to as "soft" because the signal is compressed, but sufficiently different light levels are distinguishable.

Assuming that the photodiode capacitance is linear (in actuality, it is not, but it is not so nonlinear as to greatly impact the discussion), charge collected from photogeneration in the photodiode space-charge region affects the node voltage as follows:

$$V_{node} = V_{reset} - Q_{collected}/C_{diode}$$

which over time describes a straight line. When $V_{node}$ passes below $V_{m}$, the output of the pixel saturates since the source-follower output circuit that includes transistors M3 and M4 saturates. The source-follower output circuit saturates due to the input being below $V_{m}$, which is a commonly understood limitation of the source-follower amplifier used as the output buffer in the pixel.

To avoid saturation, the soft saturation circuit 62 of the present invention "slows" the effect of collected charge on the pixel node voltage 64 as this node approaches $V_{m}$. In one embodiment of the present invention, $V_{m}$ is approximately 1V when body-effect is included. The cell configured in accordance with the teachings of the present invention provides a "soft" saturation since, as is evident in FIGS. 6 and 7, the cell output (on the bitline) gently curves and asymptotically approaches 0V instead of abruptly stopping at 0V.

The soft-saturation circuit 62 includes an N type transistor stacked on top of a P-type transistor (transistor M6, transistor M5, respectively). After precharge, the photodiode's N-doped side (node 64) is biased to approximately $V_{cc}$. In one embodiment, $V_{cc}$ is approximately equal to 3.3V. In the preferred embodiment, a supply voltage is employed to precharge device transistor M1 to avoid the $V_{t}$ drop across the gate electrode and the drain electrode.

Low Light Level Operation

The charge collected is integrated, and the photodiode bias decreases correspondingly. Initially, the soft saturation circuit 62 is not in operation (i.e., transistors M6 and M5 are off). For example, in one embodiment of the present invention, when the electrical signal at the pixel node has a measure of approximately 2.0V to 3.3V, the soft saturation circuit 62 does not affect the electrical signal (i.e., the electrical signal is provided to the readout circuit without modification). Thus, as discussed above, the light intensity to output voltage function is essentially linear at low light levels.

High Light Level Operation

In this embodiment of the present invention, as the light level increases, and the measure of the electrical signal at the pixel node decreases below approximately 1.5V, the soft-saturation circuit 62 begins to affect the electrical signal at the pixel node in a nonlinear fashion (e.g., in a square-root fashion) by removing a portion of the current from the photodiode as illustrated in FIG. 5. The current through transistor M6 is exponential with respect to the bias across its drain electrode and source electrode. Consequently, the voltage on node 64 is affected and decreased by the soft saturation circuit 62 in a non-linear fashion. In the preferred embodiment, the soft saturation circuit 62 compresses the signal at the pixel node in a square-root fashion when the signal at the pixel node has a measure of approximately 0V to 2.0V. Consequently, the soft saturation circuit 62 of the present invention effectively increases the dynamic range of the image.

An important relationship that describes the sensitivity of an image sensor is the output referred conversion gain (G), described by $$G = V_{out}/e$$

where $V_{out}$ is the output voltage, and e is the number of electrons collected by the pixel photodiode.

Figure 1:
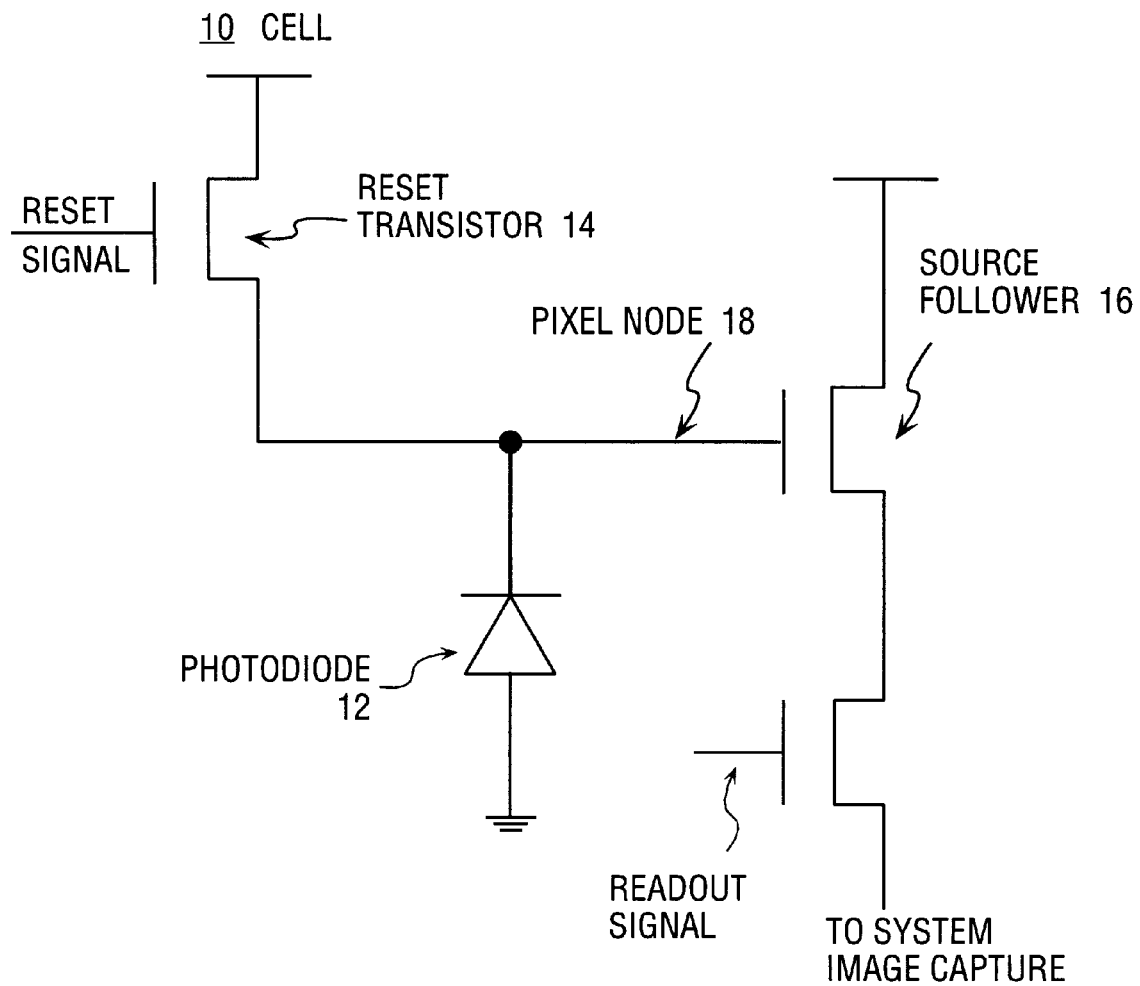
FIG. 1 illustrates a conventional active pixel sensor employed in image capture devices.
Figure 2:
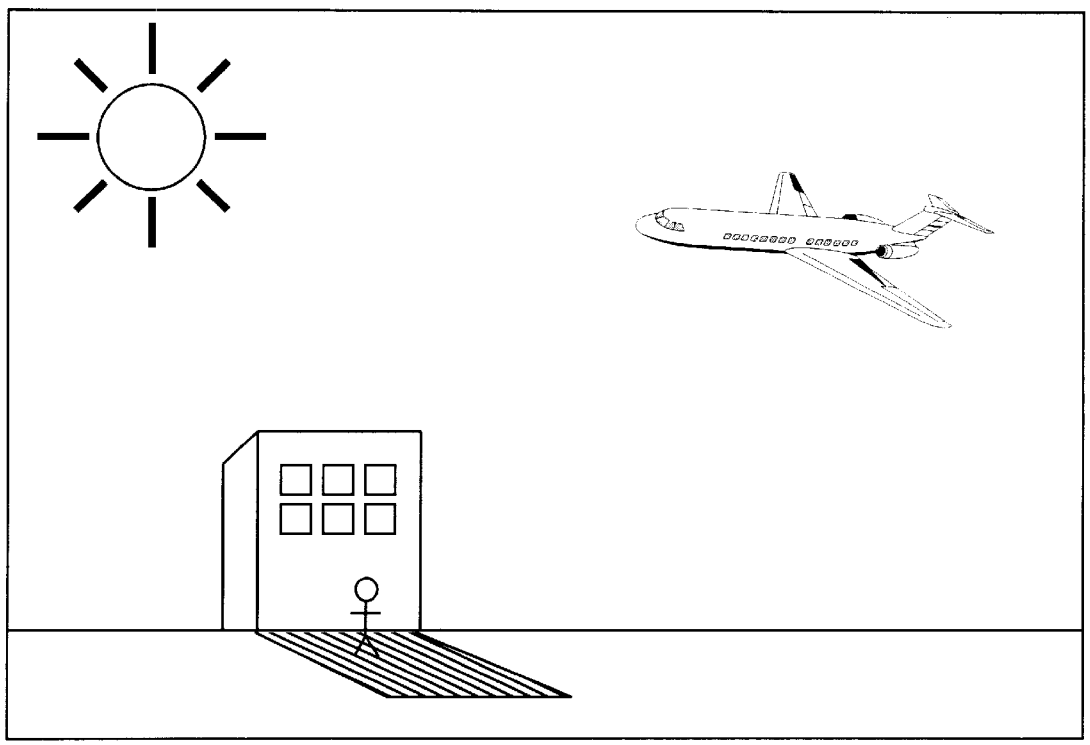
FIG. 2 illustrates a scene presented to an image capture device for processing.

In conventional approaches, as the one illustrated in FIG. 1, G is essentially a constant value.

The basic cell of the present invention models the following equation:

$$G = f(Vhd\ out)/e$$

The basic cell of the present invention causes G to depend on the value of $V_{out}$, or more specifically the voltage at node 64 (integration node).

Without transistor M5, the voltage swing on node 64 would range approximately from $V_{cc}$ to −0.7V. The limited range of the source follower output circuit results in the "hard" saturation characteristic as discussed above. The limited voltage range of the output amplifier causes no resolution between different high light levels, which results in no observable contrast in the viewed image. The present invention employs transistors M5 and M6 to decrease the voltage swing on node 64 while compressing the voltage in a square-root fashion in high light conditions.

In particular, the voltage swing on node 64 for the improved cell of the present invention can range approximately from Vcc to $V_{tn}$ (approaching $V_{tn}$ asymptotically) depending on the geometries of the devices.

The minimum voltage value on node 64 is given by the following equation:

$$V_{pix}(\min) = V_{cc} - (V_{dsat}(p) + V_{tn})$$

The optimal lower limit at $V_{tn}$ is selected so that no normally expected light stimulus to the improved cell 20 causes the output source follower to saturate.

Operation of Transistors M5 and M6

Transistor M6 provides a $V_{tn}$ drop of approximately 1V including body-effect and effectively determines the linear integration part of the cell characteristics.

Transistor M5 does not have any effect until the drop across M5 is non-negligible (i.e., $V_{cc} - V_{64} > V_{tn}$ (where $V_{tn}$ is approximately equal to 1V and $V_{191}$ is approximately equal to $V_{cc} - V_{tn}$).

Since the gate and drain of transistor M5 are connected, transistor M5 is forced to operate in the saturation region. Here, $$I_{ds} = \beta/2(V_{gs} - V_{tn})^2$$

where $V_{gs} = V_{191} - V_{64}$. Hence $$Vgs - Vtn = \text{square\_root}(2 * Ids/\beta)$$

Since Vgs is the voltage on the pixel node, the soft saturation circuit compresses the signal at the pixel node accordingly.

Accordingly, $I_{ds}$ subtracts charge from the photodiode in an amount proportional to the square of the difference between $V_{191}$ and $V_{64}$. Consequently, for high light levels, transistor M5 removes additional charge increasingly quickly from node 64 as the light adds charge to node 64. "Soft saturation" characteristics are thus provided.

As noted in the example in the Background, a conventional cell with a short integration time dims everything in the scene. Accordingly, the person in the shadow may not be distinguishable from the shadowed surroundings.

A conventional cell with a longer integration time captures the person in the shadow. However, the bright sun washes out everything but the shadow and person. In other words, a longer integration time saturates many pixels in the picture. In contrast, the cell of the present invention allows for a longer integration time, but does not wash out the sun, airplane and the shadow.

The improved CMOS active-pixel sensor cell architecture having soft saturation can be implemented into a CMOS active pixel imager. The CMOS active-pixel image sensor can be a 800×600 rectangle pixel array image sensor that is suitable for single-chip color cameras, personal computer cameras (PC cameras) and special purpose imaging applications that require low cost, low power and small size. It will be understood by those skilled in the art that the improved CMOS active-pixel sensor cell architecture of the present invention can be incorporated into a variety of pixel arrays having different sizes and configurations.

Figure 8:
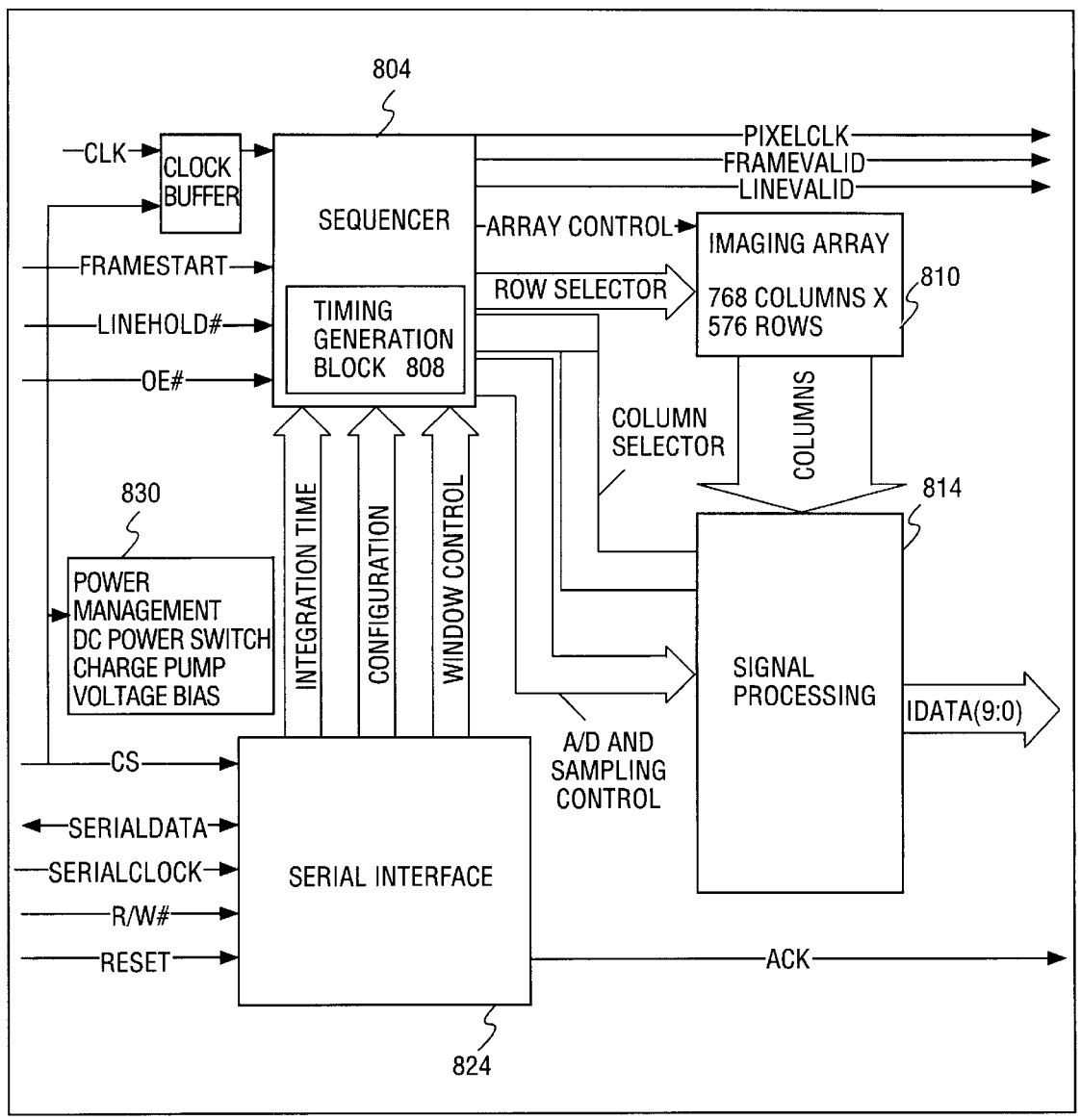
FIG. 8 illustrates a block diagram of the CMOS image sensor in which the improved CMOS active pixel cell can be implemented.

FIG. 8 illustrates a block diagram of the CMOS image sensor 800 in which the improved CMOS active pixel cell can be implemented. Appendix 1 provides the pin descriptions of the sensor illustrated in FIG. 8. The image sensor 800 supports still and video imaging and includes a sequencer block 804 for receiving control signals (CLK, FRAMESTART, LINEHOLD#, and OE#) and responsive thereto for synchronizing the sensor 800 with external circuitry (not shown). The sequencer 804 includes a timing generation block 808 that generates internal timing signals that drive an imaging array 810. The imaging array 810 includes a plurality of pixels arranged in rows and columns. Each pixel can be configured in accordance with the teachings of the present invention to include a soft saturation circuit. The sensor 800 further includes a signal processing block 814 that evaluates the pixels in the imaging array 810. The processing block 814 includes an A/D converter. The signal processing block 814 outputs pixel values in a 10-bit format (IDATA9:0).

The sensor 800 also includes a plurality of special function registers. The sensor 800 is configured through these special function registers that are programmed via a serial interface block 824. The serial interface block 824 includes a serial port and signals that can be used by an external device to transfer information to and from the sensor 800.

An external device can employ SERIALDATA, SERIALCLOCK, R/W# and RESET signals to selectively configure special function registers. The sensor 800 can optionally include a power management block 830 that provides control signals to manage the normal and low power operating modes of the sensor.

Figure 6:
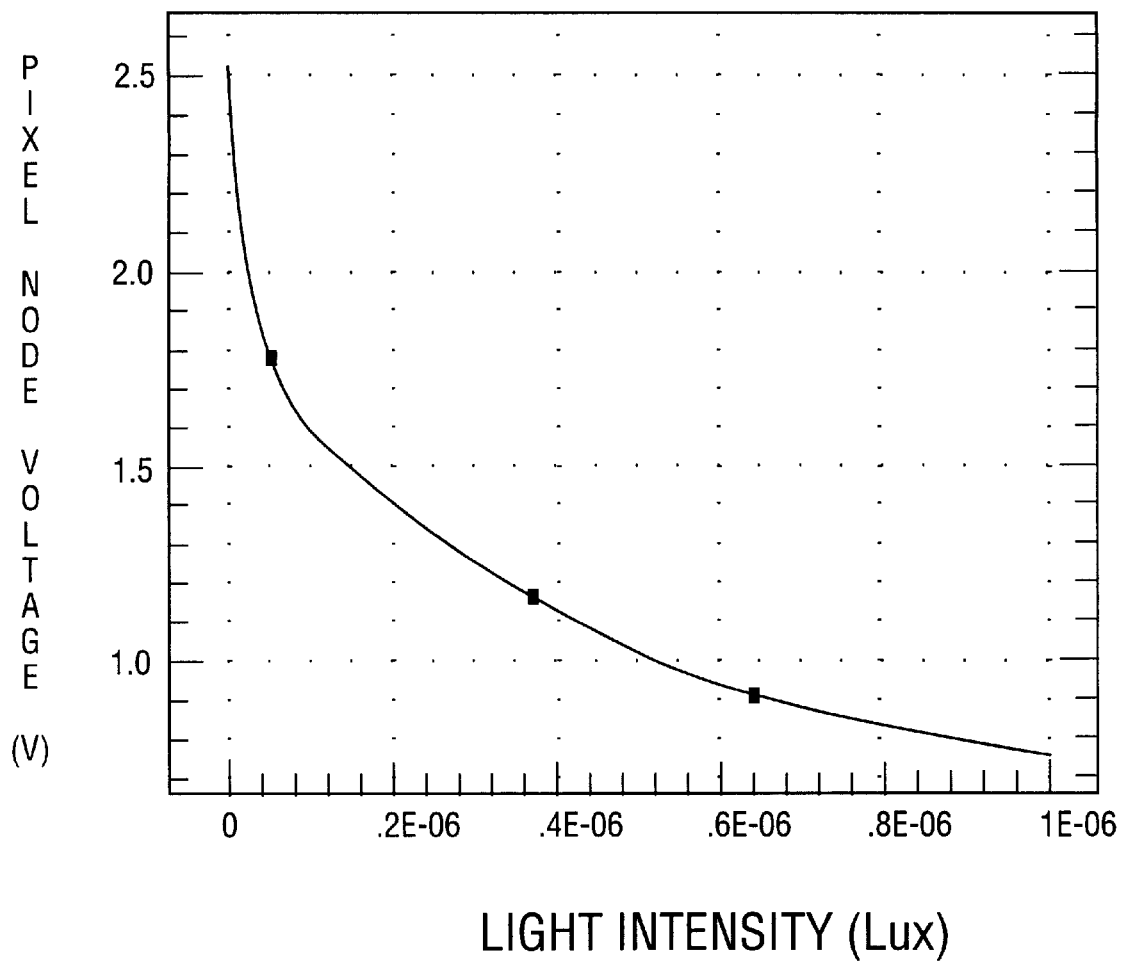
FIG. 6 illustrates the response of the active pixel sensor cell configured in accordance with one embodiment of the present invention under highlight levels.
Figure 7:
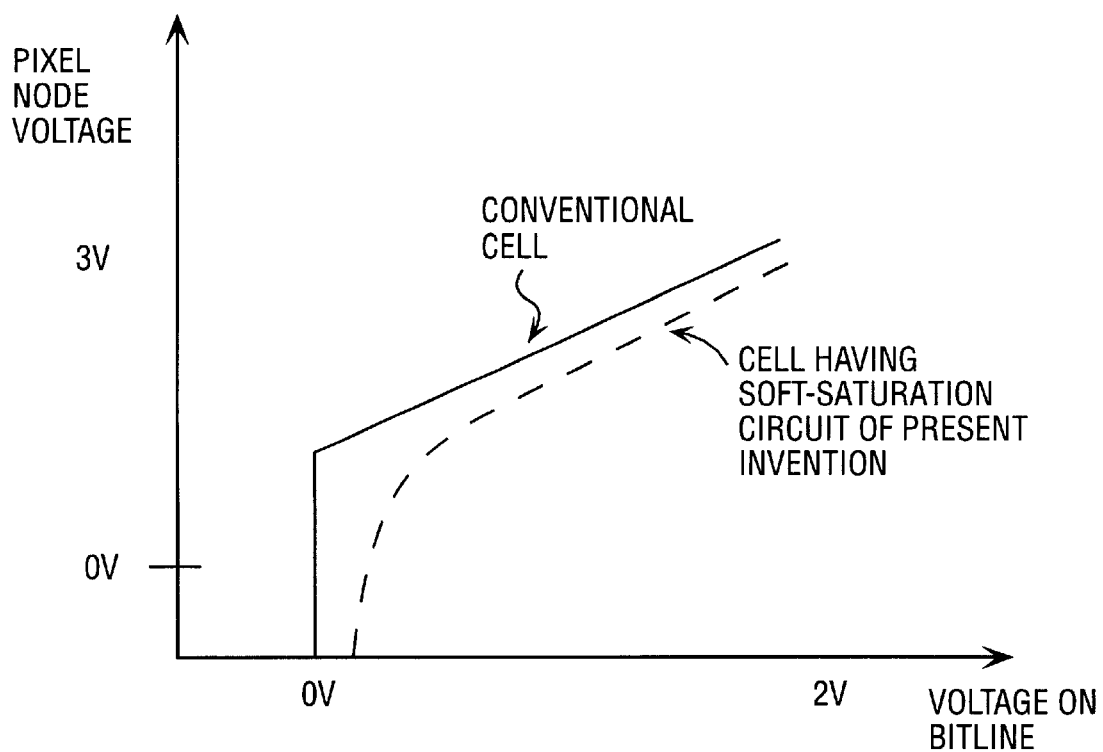
FIG. 7 illustrates a pixel node voltage versus bitline voltage graph of the active pixel sensor cell configured in accordance with one embodiment of the present invention.

In the foregoing specification, the invention has been described with reference to specific exemplary embodiments thereof. It will, however, be evident that various modifications and changes may be made thereto without departing from the broader spirit and scope of the invention as set forth in the appended claims. For example, although FIGS. 3 and 4 illustrate specific transistors that are either PMOS devices or NMOS devices, it will be understood by those skilled in the art that an equivalent functional circuit can be designed by replacing all PMOS devices with NMOS devices and the NMOS devices with PMOS devices while employing the opposite polarities at the electrodes of those devices. Moreover, FIGS. 5, 6, and 7 illustrate characteristics and behavior of one embodiment of the present invention. Although specific numerical values are shown, it will be understood by those of ordinary skill in the art that the specific numerical values for these graphs will change, depending on the specific implementation of the present invention. The specification and drawings are, accordingly, to be regarded in an illustrative rather than a restrictive sense.

| Name | Type | Description |
|---|---|---|
| IDATA9:0 | O | Image Data Bus<br>These output data lines provide pixel intensity values. OH represents zero intensity and 3FFH represents maximum intensity. |
| FRAMEVALID | O | Frame Valid<br>This active-high output signal is asserted when the image is valid. Rising edge indicates start of frame. This signal is de-asserted after the last pixel has been read out. The device is ready to capture another image 12 CLK periods after FRAMEVALID is de-asserted. |
| LINEVALID | O | Line Valid<br>This active-high output signal is asserted when the current line is valid. Rising edge indicates start of line. This signal is de-asserted after the last pixel of the line in driven on IDATA. |
| CLK | I | Input Clock<br>This clock signal is used to drive all internal timing parameters. This standard CMOS input pin must be clocked from an external driver for the image sensor to function. |
| RESET | I | Reset<br>This active-high, level-sensitive reset input places the image sensor in its power up state. |
| CS | I | Chip Select<br>This active-high input enables the image sensor. When driven low, the image sensor is in standby (powerdown) mode. |
| OE# | I | Output Enable<br>The active-low input enables all output pins when driven low. When driven high, the output pins are tri-stated high impedance pins. |
| SERIALCLK | I | Serial Clock<br>This input signal drives the clock of the synchronous serial port. After R/W# is stable, the first rising edge of this signal initiates the synchronous serial transfer. |
| R/W# | I | Serial Read/Write<br>This input selects a read operation when driven high and selects a write operation when driven low. When reading data, this input must be high for the entire time the address is transmitted. This signal must be valid before the first rising edge of SERIALCLK. |
| SERIALDATA | I/O | Serial Data<br>This bi-directional pin receives address bytes and receives or transmits data depending upon the state of the R/W# pin. This pin is an open-drain output. |
| ACK | O | Acknowledge<br>This output signal from the synchronous serial port is asserted high after receiving the eighth bit of address or data. The sensor is ready to begin receiving another packet of data as soon as this signal is asserted This signal is de-asserted upon the next rising edge of SERIALCLK. |
| LINEHOLD# | I | Line Hold<br>This active low input signal suspends the data transfer on IDATA on a row basis when asserted high. This signal is driven low during normal operation. This signal is sampled by the device during integration (see FRAMESTART) and while LINEVALID to asserted. If the signal is low during either of these conditions, the device will suspend IDATA transmission for the next row. When this signal is de-asserted (high level) the device requires 102 clocks before the next row is valid on IDATA. |
| FRAMESTART | I | Frame Start<br>This input signal is driven high to initiate a frame. A rising edge starts integration. If the device is configured for external integration mode, integration will continue until this signal is de-asserted. Otherwise, the device is configured for internal mode and the integration time is controlled by internal special function registers. This signal may remain asserted for continuous operation. For still mode, this signal must be de-asserted long enough for FRAMEVALID to go low. At this point, another image capture may be initiated. The high time of this signal must be at least 2 clocks. |
| PIXELCLK | O | Pixel Clock<br>Clock synchronized with pixel output data. The signal is derived from the CLK signal (inverted) and may be used to latch pixel data. |

We claim:

1. A method comprising:
a) provide a pixel node;
b) providing a photodiode, coupled to the pixel node, for receiving incident lighting converting said incident light into an electrical signal, said electrical signal representative of said incident light; and
c) providing a soft-saturation circuit, coupled to the pixel node, for selectively affecting the electrical signal at the pixel node based upon the electrical signal at the pixel node.

2. The method of claim 1, wherein the soft-saturation circuit affects the electrical signal in a non-linear manner when the electrical signal is in a first logical relationship with a predetermined signal value.

3. The method of claim 2, wherein the first logical relationship between the electrical signal and the predetermined signal value includes the electrical signal being greater than the predetermined signal value.

4. The method of claim 2, wherein said non-linear manner includes said soft-saturation cell affecting the electrical signal on the pixel node in a square-root fashion.

5. The method of claim 1, wherein the soft-saturation circuit does not affect the electrical signal on the pixel node when the electrical signal is in a second logical relationship with a predetermined signal value.

6. The method of claim 5, wherein the second logical relationship between the electrical signal and the predetermined signal value includes the electrical signal being less than or equal to the predetermined signal value.

7. The method of claim 2, wherein the predetermined value is approximately in the range of 2V to 0V.

8. The method of claim 5, wherein the predetermined value is approximately in the range of 3.3V to 2.0V.

9. The method of claim 2, wherein providing the soft-saturation circuit includes:
   a) providing a first transistor having a first electrode coupled to a pixel node, a second electrode coupled to the pixel node, and a third electrode; and
   b) providing a second transistor having a first electrode, coupled to a predetermined voltage, a second electrode coupled to the first electrode, and a third electrode coupled to the third electrode of the first transistor.

10. The method of claim 9, wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

11. The method of claim 1, further comprising:
   providing a readout circuit having a first electrode coupled to the pixel node, and a second electrode for receiving a readout signal, said readout circuit selectively providing an electrical signal on the pixel node based upon said readout signal.

12. The method of claim 11, wherein providing the readout circuit includes:
   a) providing a first transistor having a first electrode coupled to a predetermined voltage, a second electrode coupled to the pixel node, a third electrode; and
   b) providing a second transistor having a first electrode, coupled to the third electrode of the first transistor, a second electrode coupled to receive the readout signal, and a third electrode for providing the electrical signal on the pixel node.

13. The method of claim 12, wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

14. The method of claim 12, wherein the predetermined voltage is approximately 3.3V.

15. The method of claim 1, wherein the pixel sensor cell is manufactured with a Complimentary Metal Oxide Semiconductor (CMOS) process.

16. An pixel sensor cell comprising:
   a) a pixel node;
   b) a photodiode, coupled to the pixel node, for receiving incident lighting converting said incident light into an electrical signal, said electrical signal representative of said incident light; and
   c) a soft-saturation circuit, coupled to the pixel node, for selectively affecting the electrical signal at the pixel node based upon the electrical signal at the pixel node.

17. The pixel sensor cell of claim 16 wherein the soft-saturation circuit affects the electrical signal in a non-linear manner when the electrical signal is in a first logical relationship with a predetermined signal value.

18. The pixel sensor cell of claim 17 wherein the first logical relationship between the electrical signal and the predetermined signal value includes the electrical signal being greater than the predetermined signal value.

19. The pixel sensor cell of claim 17 wherein said non-linear manner includes said soft-saturation cell affecting the electrical signal on the pixel node in a square-root fashion.

20. The pixel sensor cell of claim 16 wherein the soft-saturation circuit does not effect the electrical signal on the pixel node when the electrical signal is in a second logical relationship with a predetermined signal value.

21. The pixel sensor cell of claim 20 wherein the second logical relationship between the electrical signal and the predetermined signal value includes the electrical signal being less than or equal to the predetermined signal value.

22. The pixel sensor cell of claim 17 wherein the predetermined value is approximately in the range of 2V to 0V.

23. The pixel sensor cell of claim 20 wherein the predetermined value is approximately in the range of 3.3V to 2.0V.

24. The pixel sensor cell of claim 17 wherein the soft-saturation circuit includes:
   a) a first transistor having a first electrode coupled to a pixel node, a second electrode coupled to the pixel node, and a third electrode; and
   b) a second transistor having a first electrode, coupled to a predetermined voltage, a second electrode coupled to the first electrode, and a third electrode coupled to the third electrode of the first transistor.

25. The pixel sensor cell of claim 24 wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

26. The pixel sensor cell of claim 16 further comprising:
   a readout circuit having a first electrode coupled to the pixel node, and a second electrode for receiving a readout signal, said readout circuit selectively providing an electrical signal on the pixel node based upon said readout signal.

27. The pixel sensor cell of claim 26 wherein the readout circuit includes:
   a) a first transistor having a first electrode coupled to a predetermined voltage, a second electrode coupled to the pixel node, a third electrode; and
   b) a second transistor having a first electrode, coupled to the third electrode of the first transistor, a second electrode coupled to receive the readout signal, and a third electrode for providing the electrical signal on the pixel node.

28. The pixel sensor cell of claim 27 wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

29. The pixel sensor cell of claim 27 wherein the predetermined voltage is approximately 3.3V.

30. The pixel sensor cell of claim 16 wherein the pixel sensor cell is manufactured with a Complimentary Metal Oxide Semi-conductor (CMOS) process.

31. An integrated image sensor circuit comprising:
   a) an imaging array having a plurality of pixel cells arranged in rows and columns, each pixel cell including a pixel node, a photodiode, coupled to the pixel node, for receiving incident lighting for converting said incident light into an electrical signal and for providing the electrical signal, said electrical signal representative of said incident light, and a soft-saturation circuit, coupled to the pixel node, for selectively affecting the electrical signal at the pixel node based upon the electrical signal at the pixel node; and
   b) a signal processor, coupled to the imaging array, for processing the electrical signal and for providing the processed electrical signal.

32. The integrated image sensor circuit of claim 31 wherein the soft-saturation circuit affects the electrical signal in a non-linear manner when the electrical signal is in a first logical relationship with a predetermined signal value.

33. The integrated image sensor circuit of claim 32 wherein the first logical relationship between the electrical signal and the predetermined signal value includes the electrical signal being greater than the predetermined signal value.

34. The integrated image sensor circuit of claim 32 wherein said non-linear manner includes said soft-saturation cell affecting the electrical signal on the pixel node in a square-root fashion.

35. The integrated image sensor circuit of claim 31 wherein the soft-saturation circuit does not effect the electrical signal on the pixel node when the electrical signal is in a second logical relationship with a predetermined signal value.

36. The integrated image sensor circuit of claim 35 wherein the second logical relationship between the electrical signal and the predetermined signal value includes the electrical signal being less than or equal to the predetermined signal value.

37. The integrated image sensor circuit of claim 32 wherein the predetermined value is approximately in the range of 2V to 0V.

38. The integrated image sensor circuit of claim 35 wherein the predetermined value is approximately in the range of 3.3V to 2.0V.

39. The integrated image sensor circuit of claim 31 further comprising:
   a) a first transistor having a first electrode coupled to a pixel node, a second electrode coupled to the pixel node, and a third electrode; and
   b) a second transistor having a first electrode, coupled to a predetermined voltage, a second electrode coupled to the first electrode, and a third electrode coupled to the third electrode of the first transistor.

40. The integrated image sensor circuit of claim 39 wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

41. The integrated image sensor circuit of claim 31 further comprising:
   a readout circuit having a first electrode coupled to the pixel node, and a second electrode for receiving a readout signal, said readout circuit selectively providing an electrical signal on the pixel node based upon said readout signal.

42. The integrated image sensor circuit of claim 41 wherein the readout circuit includes:
   a) a first transistor having a first electrode coupled to a predetermined voltage, a second electrode coupled to the pixel node, a third electrode; and
   b) a second transistor having a first electrode, coupled to the third electrode of the first transistor, a second electrode coupled to receive the readout signal, and a third electrode for providing the electrical signal on the pixel node.

43. The integrated image sensor circuit of claim 42 wherein the first transistor is a PMOS device, the first electrode, second electrode and third electrode of the first transistor are a drain electrode, gate electrode and source electrode, respectively the second transistor is an NMOS device; and the first electrode, second electrode, and third electrode of the second transistor are a drain electrode, gate electrode and source electrode, respectively.

44. The integrated image sensor circuit of claim 42 wherein the predetermined voltage is approximately 3.3V.

45. The integrated image sensor circuit of claim 31 wherein the pixel sensor cell is manufactured with a Complimentary Metal Oxide Semi-conductor (CMOS) process.

46. The integrated image sensor circuit of claim 31 further comprising a serial interface, coupled to the sequencer, said serial interface including a plurality of programmable registers, said registers programmable by said external agent through a serial bus.

47. The integrated image sensor circuit of claim 31 further comprising a power management circuit, coupled to the serial interface and the sequencer for managing a normal operating mode and a low power operating mode for the sensor.

48. The integrated image sensor circuit of claim 31 further comprising a sequencer, coupled to the imaging array and signal processor, for synchronizing the sensor with an external circuit and for controlling said imaging array.

* * * * *

UNITED STATES PATENT AND TRADEMARK OFFICE
CERTIFICATE OF CORRECTION

PATENT NO.    : 6,133,563
DATED         : October 17, 2000
INVENTOR(S)   : Clark et al.

It is certified that error appears in the above-identified patent and that said Letters Patent is hereby corrected as shown below:

<u>Column 5,</u>
Line 13, delete "G= f(Vhd out)/e" and replace with -- G= f(V out)/e --.

Signed and Sealed this

First Day of January, 2002

Attest:

Attesting Officer

JAMES E. ROGAN
*Director of the United States Patent and Trademark Office*